(12) United States Patent
Qing

(10) Patent No.: US 11,922,882 B2
(45) Date of Patent: Mar. 5, 2024

(54) PIXEL CIRCUIT AND DRIVING METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventor: Haigang Qing, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/296,295

(22) PCT Filed: Sep. 29, 2020

(86) PCT No.: PCT/CN2020/118660
§ 371 (c)(1),
(2) Date: May 24, 2021

(87) PCT Pub. No.: WO2022/016706
PCT Pub. Date: Jan. 27, 2022

(65) Prior Publication Data
US 2023/0144601 A1 May 11, 2023

(30) Foreign Application Priority Data
Jul. 21, 2020 (CN) .......................... 202010707046.2

(51) Int. Cl.
*G09G 3/32* (2016.01)
*G09G 3/3233* (2016.01)
*G09G 3/3258* (2016.01)

(52) U.S. Cl.
CPC ......... *G09G 3/3258* (2013.01); *G09G 3/3233* (2013.01); *G09G 2300/0426* (2013.01);
(Continued)

(58) Field of Classification Search
CPC ......... G09G 3/3233; G09G 2300/0819; G09G 2300/0842; G09G 2300/0861;
(Continued)

(56) References Cited

U.S. PATENT DOCUMENTS 6,580,657 B2 6/2003 Sanford et al.
11,114,030 B1 * 9/2021 Lu .................. G09G 3/3233
(Continued)

FOREIGN PATENT DOCUMENTS

CN 102467876 A 5/2012
CN 105489167 A 4/2016
(Continued)

OTHER PUBLICATIONS

Office Action for Chinese Application No. 202010707046.2 dated Jun. 27, 2022.
(Continued)

*Primary Examiner* — Roy P Rabindranath
(74) *Attorney, Agent, or Firm* — ArentFox Schiff LLP; Michael Fainberg

(57) ABSTRACT

According to a pixel circuit and a driving method therefor, and a display apparatus provided by the embodiments of the present disclosure, a signal of a data signal end may be provided to a first end of a driving transistor through a data writing circuit under the control of a signal of a scanning signal end. A control end of the driving transistor is initialized through a second reset circuit according to a signal of an initializing signal end; and under the control of a signal of a light emitting control signal end, a first power end and the first end of the driving transistor are turned on through a light emitting control circuit, and a second end of the driving transistor and a light emitting device are turned on.

18 Claims, 13 Drawing Sheets

(52) U.S. Cl.
CPC ........... *G09G 2300/0819* (2013.01); *G09G 2300/0842* (2013.01); *G09G 2300/0861* (2013.01); *G09G 2310/0278* (2013.01); *G09G 2310/061* (2013.01); *G09G 2310/08* (2013.01); *G09G 2320/0233* (2013.01); *G09G 2320/045* (2013.01)

(58) Field of Classification Search
CPC ....... G09G 2310/08; G09G 2320/0233; G09G 2320/045
See application file for complete search history.

(56) References Cited

U.S. PATENT DOCUMENTS

| | | |
|---|---|---|
| 2012/0105410 A1 | 5/2012 | Choi et al. |
| 2014/0111563 A1 | 4/2014 | Hwang et al. |
| 2014/0354517 A1 | 12/2014 | Chung et al. |
| 2016/0133191 A1 | 5/2016 | Kang et al. |
| 2016/0225318 A1 | 8/2016 | Choi |
| 2019/0073955 A1 | 3/2019 | Zou et al. |
| 2019/0095016 A1* | 3/2019 | Yang ............... G06F 3/0443 |
| 2019/0147798 A1 | 5/2019 | Hwang et al. |
| 2020/0234633 A1 | 7/2020 | Wang et al. |
| 2020/0320937 A1 | 10/2020 | Yang et al. |
| 2021/0312861 A1 | 10/2021 | Wang et al. |
| 2021/0390906 A1* | 12/2021 | Pyun ............... G09G 3/3266 |
| 2022/0157238 A1 | 5/2022 | Wang et al. |

FOREIGN PATENT DOCUMENTS

| | | |
|---|---|---|
| CN | 106935198 A | 7/2017 |
| CN | 107564474 A | 1/2018 |
| CN | 108182907 A | 6/2018 |
| CN | 109712565 A | 5/2019 |
| CN | 109979394 A | 7/2019 |
| CN | 111243526 A | 6/2020 |

OTHER PUBLICATIONS

U.S. Office Action for U.S. Appl. No. 17/771,499 dated Mar. 28, 2022.

* cited by examiner

PIXEL CIRCUIT AND DRIVING METHOD THEREFOR, AND DISPLAY APPARATUS

CROSS REFERENCE TO RELATED APPLICATIONS

This application is a US National Stage of International Application No. PCT/CN2020/118660, filed on Sep. 29, 2020, which claims priority to China Patent Application No. 202010707046.2, filed on Jul. 21, 2020 in China Patent Office and entitled "Display Apparatus and Driving Method Therefor", which is hereby incorporated by reference in its entirety.

FIELD

The present disclosure relates to the field of a display technology, and particularly relates to a pixel circuit and a driving method therefor, and a display apparatus.

BACKGROUND

An organic light emitting diode (OLED) is one of the hot spots in the field of researches on flat panel displays today. Based on the advantages of low energy consumption, low production cost, self-luminescence, wide viewing angle, fast response and the like, OLED displays have begun to be widely used in display fields such as mobile phones, flat computers, and digital cameras. Generally, OLEDs are driven by current, so that a stable current is required to control light emission.

SUMMARY

A pixel circuit provided by the embodiments of the present disclosure includes:
  a data writing circuit, which is electrically connected to a first end of a driving transistor and is configured to provide a signal of a data signal end to the first end of the driving transistor under the control of a signal of a scanning signal end;
  a compensation capacitor, wherein a first end of the compensation capacitor is electrically connected to a first power end, and a second end of the compensation capacitor is electrically connected to the first end of the driving transistor;
  a storage circuit, which is electrically connected to a control end of the driving transistor and the first power end respectively;
  a second reset circuit, which is electrically connected to the control end of the driving transistor and is configured to initialize the control end of the driving transistor according to a signal of an initializing signal end; and
  a light emitting control circuit, which is electrically connected to the first power end, the first end and a second end of the driving transistor and a light emitting device, and is configured to turn on the first power end and the first end of the driving transistor and turn on the second end of the driving transistor and the light emitting device under the control of a signal of a light emitting control signal end, for driving the light emitting device to emit light.
In some examples, the pixel circuit further includes:
  a threshold compensation circuit, which is electrically connected to the control end and the second end of the driving transistor respectively and is configured to turn on the control end and the second end of the driving transistor under the control of a signal of a first control signal end, for compensating a threshold.
In some examples, the threshold compensation circuit includes:
  a first transistor; wherein a control end of the first transistor is electrically connected to the first control signal end, a first end of the first transistor is electrically connected to the control end of the driving transistor, and a second end of the first transistor is electrically connected to the second end of the driving transistor.
In some examples, the pixel circuit further includes:
  a first reset circuit, which is electrically connected to the light emitting device and is configured to provide the signal of the initializing signal end to the light emitting device under the control of a signal of a second control signal end.
In some examples, the first reset circuit includes:
  a second transistor; wherein a control end of the second transistor is electrically connected to the second control signal end, a first end of the second transistor is electrically connected to the initializing signal end, and a second end of the second transistor is electrically connected to the light emitting device.
In some examples, the storage circuit includes:
  a storage capacitor; wherein a first end of the storage capacitor is electrically connected to the first power end, and a second end of the storage capacitor is electrically connected to the control end of the driving transistor.
In some examples, the second reset circuit includes:
  a third transistor; wherein a control end of the third transistor is electrically connected to the reset signal end, a first end of the third transistor is electrically connected to the initializing signal end, and a second end of the third transistor is electrically connected to the control end of the driving transistor.
In some examples, the second reset circuit further includes:
  an auxiliary transistor; wherein a control end of the auxiliary transistor is electrically connected to the scanning signal end, a first end of the auxiliary transistor is electrically connected to the second end of the third transistor, and a second end of the auxiliary transistor is electrically connected to the control end of the driving transistor.
In some examples, the light emitting control circuit includes:
  a fourth transistor; wherein a control end of the fourth transistor is electrically connected to the light emitting control signal end, a first end of the fourth transistor is electrically connected to the first power end, and a second end of the fourth transistor is electrically connected to the first end of the driving transistor; and
  a fifth transistor; wherein a control end of the fifth transistor is electrically connected to the light emitting control signal end, a first end of the fifth transistor is electrically connected to the second end of the driving transistor, and a second end of the fifth transistor is electrically connected to the light emitting device.
In some examples, the data writing circuit includes:
  a sixth transistor; wherein a control end of the sixth transistor is electrically connected to the scanning control signal end, a first end of the sixth transistor is electrically connected to the data signal end, and a second end of the sixth transistor is electrically connected to the first end of the driving transistor.

A driving method for the pixel circuit provided by the embodiments of the present disclosure includes:
  in a reset phase: the second reset circuit initializing the control end of the driving transistor according to the signal of the initializing signal end;
  in a threshold compensation phase: the data writing circuit providing the signal of the data signal end to the first end of the driving transistor and storing the signal through the compensation capacitor under the control of the signal of the scanning signal end, and the threshold compensation circuit turning on the control end and the second end of the driving transistor under the control of the signal of the first control signal end for compensating a threshold;
  in a compensation holding phase: the threshold compensation circuit turning on the control end and the second end of the driving transistor under the control of the signal of the first control signal for compensating a threshold; and
  in a light emitting phase: the light emitting control circuit turning on the first power end and the first end of the driving transistor and turning on the second end of the driving transistor and the light emitting device under the control of the signal of the light emitting control signal end, for driving the light emitting device to emit light.

In some examples, the second control signal end and the first control signal end are the same signal end; and
  the driving method further includes:
  in the threshold compensation phase, the first reset circuit providing the signal of the initializing signal end to the light emitting device under the control of the signal of the second control signal end; and
  in the compensation holding phase, the first reset circuit providing the signal of the initializing signal end to the light emitting device under the control of the signal of the second control signal end.

In some examples, the second control signal end and the reset signal end are the same signal end; and
  the driving method further includes:
  in the reset phase, the first reset circuit providing the signal of the initializing signal end to the light emitting device under the control of the signal of the second control signal end.

In some examples, the second control signal end and the scanning signal end are the same signal end; and
  the driving method further includes:
  in the threshold compensation phase, the first reset circuit providing the signal of the initializing signal end to the light emitting device under the control of the signal of the second control signal end.

In some examples, the driving method further includes:
  in the reset phase, the first reset circuit providing the signal of the initializing signal end to the light emitting device under the control of the signal of the second control signal end;
  in the threshold compensation phase, the first reset circuit providing the signal of the initializing signal end to the light emitting device under the control of the signal of the second control signal end; and
  in the compensation holding phase, the first reset circuit providing the signal of the initializing signal end to the light emitting device under the control of the signal of the second control signal end.

In some examples, the driving method further includes:
  in the compensation holding phase, the first reset circuit providing the signal of the initializing signal end to the light emitting device under the control of the signal of the second control signal end.

In some examples, before the reset phase, the driving method further includes:
  in an initializing phase: the first reset circuit providing the signal of the initializing signal end to the light emitting device under the control of the signal of the second control signal end.

In some examples, after the reset phase and before the threshold compensation phase, the driving method further includes:
  in an initializing phase: the first reset circuit providing the signal of the initializing signal end to the light emitting device under the control of the signal of the second control signal end.

In some examples, the pixel circuit further includes: a first reset circuit. Before the reset phase, the driving method further includes: an anode reset phase; wherein in the anode reset phase, the first reset circuit provides the signal of the initializing signal end to the light emitting device under the control of the signal of the second control signal end to initialize the light emitting device; and
  the driving method further includes: in the reset phase, the first reset circuit providing the signal of the initializing signal end to the light emitting device under the control of the signal of the second control signal end to initialize the light emitting device; and the data writing circuit providing the signal of the data signal end to the first end of the driving transistor under the control of the signal of the scanning signal end.

A display apparatus provided by the embodiments of the present disclosure includes the above-mentioned pixel circuit.

DETAILED DESCRIPTION OF THE EMBODIMENTS

Figure 1:
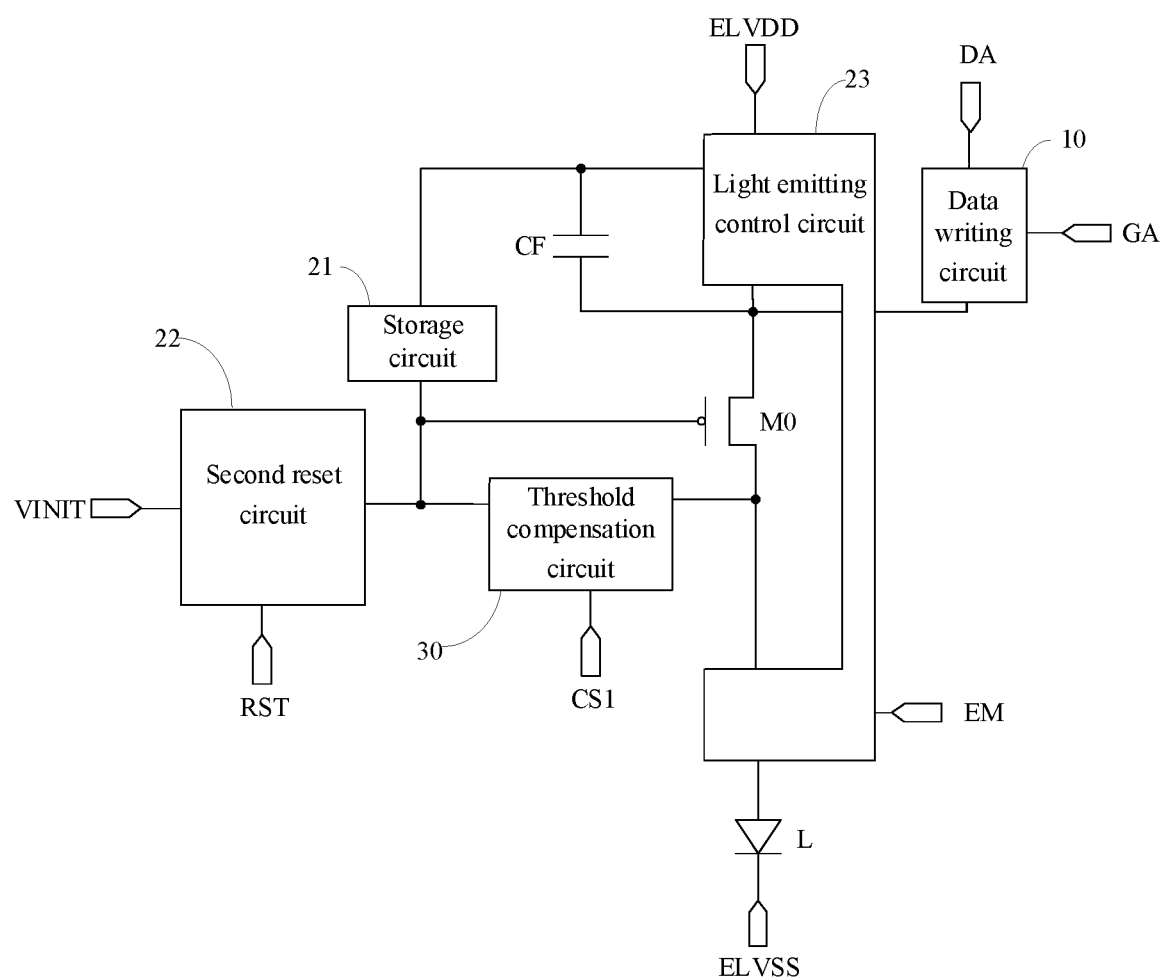
FIG. 1 illustrates a schematic structural diagram of a pixel circuit in the embodiments of the present disclosure.

In order to make the objectives, technical solutions and advantages of the embodiments of the present disclosure clearer, the technical solutions of the embodiments of the present disclosure are described clearly and completely below in conjunction with the accompanying drawings in the embodiments of the present disclosure. Obviously, the described embodiments are a part of the embodiments of the present disclosure, not all the embodiments. Furthermore, the embodiments in the present disclosure and features in the embodiments may be combined with each other without conflicts. Based on the described embodiments of the present disclosure, all other embodiments obtained by those ordinarily skilled in the art without creative work shall fall within the protection scope of the present disclosure.

Unless otherwise defined, technical terms or scientific terms used in the present disclosure shall be ordinary meanings as understood by those of ordinary skill in the art of the present disclosure. The words "first", "second" and similar terms used in the present disclosure do not denote any order, quantity or importance, but are merely used to distinguish different components. The word "including" or "includes" or the like means that the element or item preceding the word covers the element or object listed after the word and its equivalent, without excluding other elements or objects. The words "connection" or "connected" and the like are not limited to physical or mechanical connections, but may include electrical connections, whether direct or indirect.

It should be noted that the sizes and shapes of all patterns in the drawings do not reflect real scales, and are merely to illustrate the contents of the present disclosure. Furthermore, the same or similar numerals throughout indicate same or similar elements or elements with same or similar functions.

Some pixel circuits provided by the embodiments of the present disclosure, as shown in FIG. 1, may include:
- a data writing circuit 10, which is electrically connected to a first end of a driving transistor M0 and is configured to provide a signal of a data signal end DA to the first end of the driving transistor M0 under the control of a signal of a scanning signal end GA;
- a compensation capacitor CF, wherein a first end of the compensation capacitor CF is electrically connected to a first power end ELVDD, and a second end of the compensation capacitor CF is electrically connected to the first end of the driving transistor M0;
- a storage circuit 21, which is electrically connected to a control end of the driving transistor M0 and the first power end ELVDD respectively;
- a second reset circuit 22, which is electrically connected to the control end of the driving transistor M0 and is configured to initialize the control end of the driving transistor M0 according to a signal of an initializing signal end VINIT; for example, the second reset circuit 22 is configured to provide the signal of the initializing signal end VINIT to the control end of the driving transistor M0 under the control of a signal of a reset signal end RST; and
- a light emitting control circuit 23, which is electrically connected to the first power end ELVDD, the first end and a second end of the driving transistor M0 and a light emitting device L, and is configured to turn on the first power end ELVDD and the first end of the driving transistor M0 and turn on the second end of the driving transistor M0 and the light emitting device L under the control of a signal of a light emitting control signal end EM, for driving the light emitting device L to emit light.

According to the above-mentioned pixel circuit provided by the embodiments of the present disclosure, the control end of the driving transistor may be initialized through the second reset circuit according to the signal of the initializing signal end. The signal of the data signal end may be provided to the first end of the driving transistor through the data writing circuit under the control of the signal of the scanning signal end. The first power end, the first end of the driving transistor, the second end of the driving transistor and the light emitting device may be turned on through the light emitting control circuit under the control of the signal of the light emitting control signal end, so as to drive the light emitting device to emit light. Through the arrangement of the compensation capacitor, since the compensation capacitor is electrically connected to the first end of the driving transistor, the signal input to the first end of the driving transistor may be stored, and a voltage input to the first end of the driving transistor can be stabilized. In this way, when the second end of the driving transistor and the light emitting device are turned on, the light emitting device may be stably driven to emit light, so that the display uniformity may be improved.

Due to a technological process, device aging and the like, a threshold voltage Vth of the driving transistor M0 will offset, which causes that the light emitting brightness of light emitting devices L in different regions in the display apparatus is not uniform, thus affecting the display effect. In view of this, in the embodiments of the present disclosure, as shown in FIG. 1, the pixel circuit may further include: a threshold compensation circuit 30; the threshold compensation circuit 30 is electrically connected to the control end and the second end of the driving transistor M0 respectively, and is configured to turn on the control end and the second end of the driving transistor M0 under the control of the signal of the first control signal end CS1, so as to compensate a threshold. Therefore, through the arrangement of the threshold compensation circuit 30, a function for compensating the threshold voltage of the driving transistor M0 may be realized.

The present disclosure is described in detail below in combination with the specific embodiments. It should be noted that the present embodiment is intended to better explain the present disclosure, and not intended to limit the present disclosure.

During specific implementation, in the above-mentioned pixel circuit provided by the embodiments of the present disclosure, a first end of the light emitting device L is electrically connected to the light emitting control circuit 23, and a second end of the light emitting device L is electrically connected to a second power end ELVSS. Exemplarily, the first end of the light emitting device L electrically connected to the light emitting control circuit 23 is an anode, and the second end electrically connected to the second power end ELVSS is a cathode. For example, the light emitting device L may be at least one of an organic light emitting diode and a quantum dot light emitting diode. Furthermore, the light emitting device L realizes light emission under the action of a current when the driving transistor M0 is in a saturated state. In addition, the light emitting device L generally has a turn-on voltage, and emits light when a voltage difference of two ends of the light emitting device L is greater than or equal to the turn-on voltage.

During specific implementation, in the above-mentioned pixel circuit provided by the embodiments of the present disclosure, a voltage Vdd of the first power end ELVDD is generally positive, and a voltage Vss of the second power end ELVSS is generally grounded or negative. Furthermore, a voltage Vini of the initial signal end and the voltage Vss of the second power end ELVSS need to satisfy the formula: Vini−Vss<Vth(L), wherein Vth(L) is the turn-on voltage of the light emitting device L.

Figure 2:
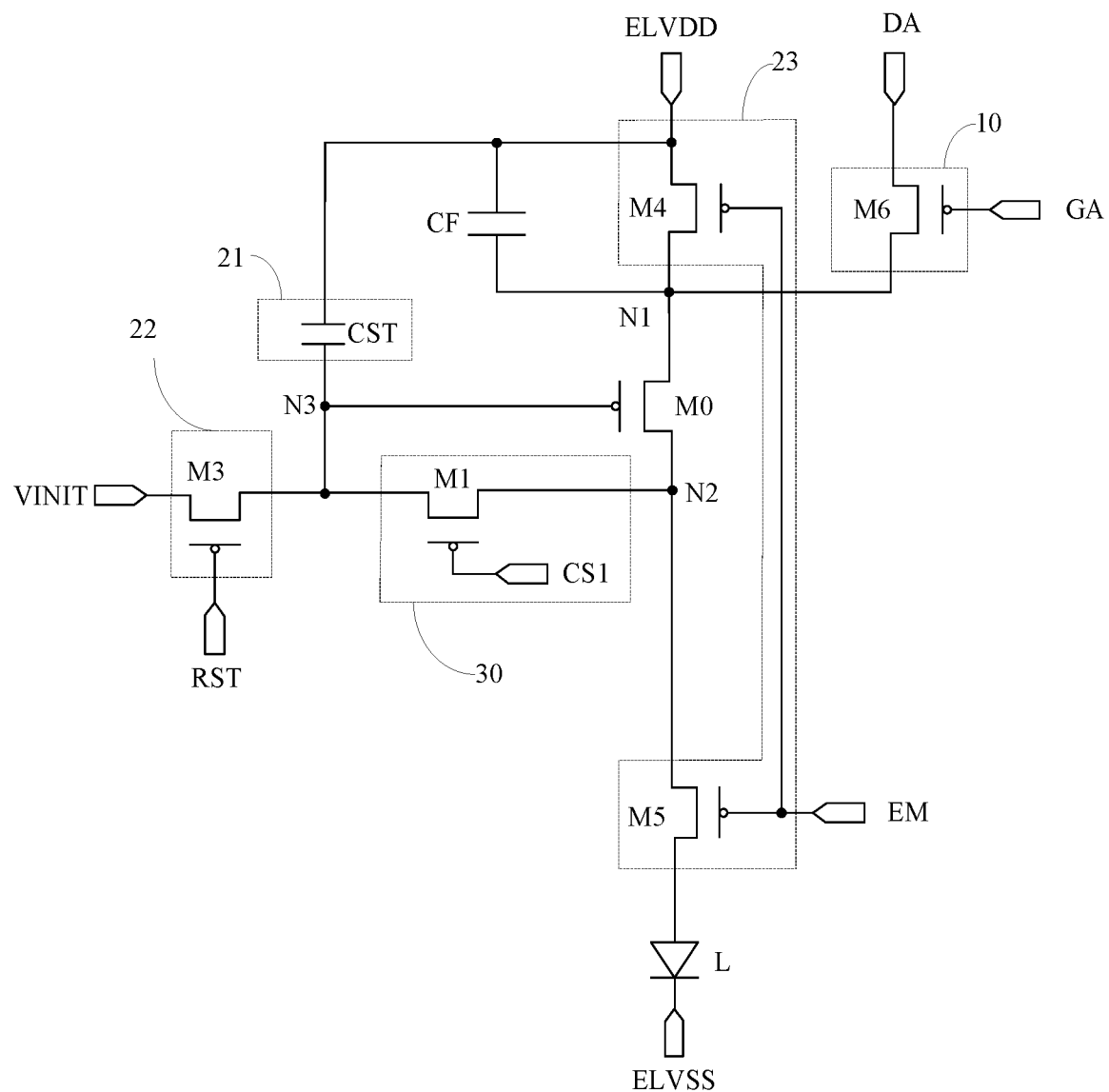
FIG. 2 illustrates a specific schematic structural diagram of some pixel circuits in the embodiments of the present disclosure.

During specific implementation, in the above-mentioned pixel circuit provided by the embodiments of the present disclosure, as shown in FIG. 1 and FIG. 2, the driving transistor M0 may be a P-type transistor; wherein the control end N3 of the driving transistor M0 may be a gate, the first end N1 of the driving transistor M0 may be a source, and the second end N2 of the driving transistor M0 may be a drain. Or, the driving transistor M0 may also be an N-type transistor; wherein the control end N3 of the driving transistor M0 may be a gate, the first end N1 of the driving transistor M0 may be a drain, and the second end N2 of the driving transistor M0 may be a source. In actual application, the type of the driving transistor M0 may specifically be designed and determined according to the needs of the actual application, which is not limited here.

During specific implementation, in the above-mentioned pixel circuit provided by the embodiments of the present disclosure, as shown in FIG. 2, the threshold compensation circuit 30 may include: a first transistor M1; wherein a control end of the first transistor M1 is electrically connected to a first control signal end CS1, a first end of the first transistor M1 is electrically connected to the control end of the driving transistor M0, and a second end of the first transistor M1 is electrically connected to the second end of the driving transistor M0.

During specific implementation, in the above-mentioned pixel circuit provided by the embodiments of the present disclosure, as shown in FIG. 2, the storage circuit 21 may include: a storage capacitor CST; wherein a first end of the storage capacitor CST is electrically connected to the first power end ELVDD, and a second end of the storage capacitor CST is electrically connected to the control end of the driving transistor M0.

During specific implementation, in the above-mentioned pixel circuit provided by the embodiments of the present disclosure, as shown in FIG. 2, the second reset circuit 22 may include: a third transistor M3; wherein a control end of the third transistor M3 is electrically connected to a reset signal end RST, a first end of the third transistor M3 is electrically connected to the initializing signal end VINIT, and a second end of the third transistor M3 is electrically connected to the control end of the driving transistor M0.

During specific implementation, in the above-mentioned pixel circuit provided by the embodiments of the present disclosure, as shown in FIG. 2, the light emitting control circuit 23 includes: a fourth transistor M4 and a fifth transistor M5; wherein a control end of the fourth transistor M4 is electrically connected to the light emitting control signal end EM, a first end of the fourth transistor M4 is electrically connected to the first power end ELVDD, and a second end of the fourth transistor M4 is electrically connected to the first end of the driving transistor M0. A control end of the fifth transistor M5 is electrically connected to the light emitting control signal end EM, a first end of the fifth transistor M5 is electrically connected to the second end of the driving transistor M0, and a second end of the fifth transistor M5 is electrically connected to the light emitting device L.

During specific implementation, in the above-mentioned pixel circuit provided by the embodiments of the present disclosure, as shown in FIG. 2, the data writing circuit 10 includes: a sixth transistor M6; wherein a control end of the sixth transistor M6 is electrically connected to the scanning signal end GA, a first end of the sixth transistor M6 is electrically connected to the data signal end DA, and a second end of the sixth transistor M6 is electrically connected to the first end of the driving transistor M0.

Further, in order to simplify the flow of a manufacturing process of the pixel circuit, during specific implementation, in the above-mentioned pixel circuit provided by the embodiments of the present disclosure, as shown in FIG. 2, all the transistors may be P-type transistors. Or, all the transistors may be N-type transistors. They are not limited here.

During specific implementation, in the above-mentioned display panel provided by the embodiments of the present disclosure, the P-type transistors are turned off under the action of a high level and turned on under the action of a low level. The N-type transistors are turned on under the action of a high level and turned off under the action of a low level.

It should be noted that in the above-mentioned pixel circuit provided by the embodiments of the present disclosure, the above-mentioned transistors may be thin film transistors (TFTs), or metal oxide semiconductor (MOS) field-effect transistors. They are not limited here. During specific implementation, the control ends of the above transistors may be used as gates. Furthermore, according to the type of the transistors and different signals of the control ends, the first ends of the above transistors may be used as sources, and the second ends may be used as drains. Or the first ends of the above transistors are used as drains, and the second ends are used as sources. No limitation is made here.

A driving method for the above-mentioned pixel circuit provided by the embodiments of the present disclosure includes the following steps:

in a reset phase: the second reset circuit initializes the control end of the driving transistor according to the signal of the initializing signal end;

in a threshold compensation phase: the data writing circuit provides the signal of the data signal end to the first end of the driving transistor and stores the signal through the compensation capacitor under the control of the signal of the scanning signal end, and the threshold compensation circuit turns on the control end and the second end of the driving transistor under the control of the signal of the first control signal end for compensating a threshold;

in a compensation holding phase: the threshold compensation circuit turns on the control end and the second end of the driving transistor under the control of the signal of the first control signal for compensating a threshold; and in a light emitting phase: the light emitting control circuit turns on the first power end and the first end of the driving transistor and turns on the second end of the driving transistor and the light emitting device under the control of the signal of the light emitting control signal end, for driving the light emitting device to emit light.

Figure 3:
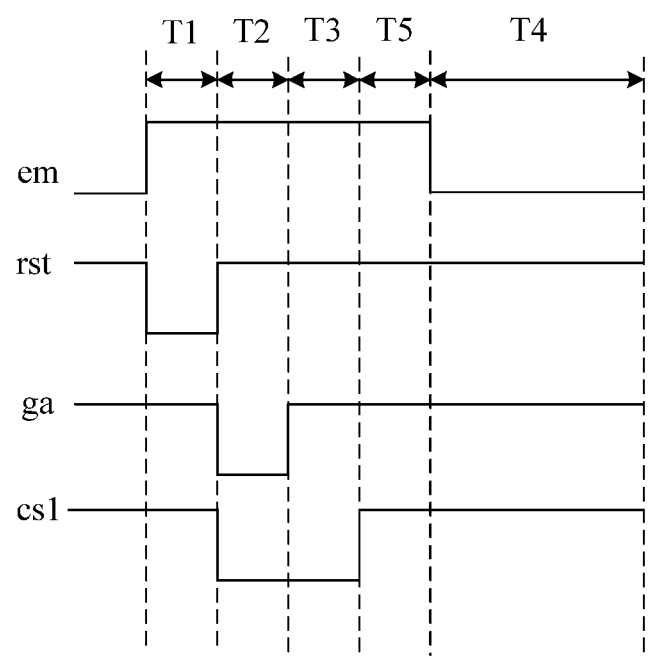
FIG. 3 illustrates some signal time sequence diagrams in the embodiments of the present disclosure.

The pixel circuit shown in FIG. 2 is taken as an example below to describe the working process of the above-mentioned pixel circuit provided by the embodiments of the present disclosure in combination with the circuit time sequence diagram shown in FIG. 3. As shown in FIG. 3, em represents the signal loaded to the light emitting control signal end EM; rst represents the signal loaded to the reset signal end RST; ga represents the signal loaded to the scanning signal end GA; and cs1 represents the signal loaded to the first control signal end CS1. Furthermore, the working process of one pixel circuit in one display frame may include: a reset phase T1, a threshold compensation phase T2, a compensation holding phase T3 and a light emitting phase T4.

In the reset phase T1, the third transistor M3 is turned on under the control of a low level of the signal rst to provide the signal of the initializing signal end VINIT to the control end N3 of the driving transistor M0, so as to make the voltage of the control end N3 of the driving transistor M0 be Vini, thereby initializing the control end of the driving transistor M0. Furthermore, the first transistor M1 is turned off under the control of a high level of the signal cs1. The sixth transistor M6 is turned off under the control of a high level of the signal ga. The fourth transistor M4 and the fifth transistor M5 are turned off under the control of a high level of the signal em.

In the threshold compensation phase T2, the sixth transistor M6 is turned on under the control of a low level of the signal ga to provide the signal of the data signal end DA to the first end N1 of the driving transistor M0, so that the voltage of the first end N1 of the driving transistor M0 is as the voltage Vda of the signal of the data signal end DA, and the voltage Vda is stored through the compensation capacitor CF. The first transistor M1 is turned on under the control of a low level of the signal cs1 to turn on the control end N3 and the second end N2 of the driving transistor M0, so that the driving transistor M0 forms a diode connection mode, to further enable the voltage Vda of the first end N1 of the driving transistor M0 to charge the control end N3 of the driving transistor M0. Furthermore, the third transistor M3 is turned off under the control of a high level of the signal rst. The fourth transistor M4 and the fifth transistor M5 are turned off under the control of the high level of the signal em.

In the compensation holding phase T3, the compensation capacitor CF stores the voltage Vda, and the first transistor M1 is turned on under the control of the low level of the signal cs1 to turn on the control end N3 and the second end N2 of the driving transistor M0, so that the driving transistor M0 forms a diode connection mode, to further enable the voltage Vda of the first end N1 of the driving transistor M0 to continue to charge the control end N3 of the driving transistor M0, so that the voltage of the control end N3 of the driving transistor M0 may be charged to be Vda−|Vth|. Furthermore, the sixth transistor M6 is turned off under the control of the high level of the signal ga. The third transistor M3 is turned off under the control of the high level of the signal rst. The fourth transistor M4 and the fifth transistor M5 are turned off under the control of the high level of the signal em.

In the light emitting phase T4, both the fourth transistor M4 and the fifth transistor M5 are turned on under the control of the low level of the signal em. The turned-on fourth transistor M4 may provide the voltage Vdd of the first power end ELVDD to the first end N1 of the driving transistor M0, so as to cause the voltage of the first end N1 of the driving transistor M0 to be Vdd. In this way, the driving transistor M0 may be in a saturated state, so that the driving transistor M0 generates a working current Ids: $Ids=K(Vdd-Vda)^2$. The turned-on fifth transistor M5 can turn on the second end N2 of the driving transistor M0 and the light emitting device L, so that the working current Ids flows into the light emitting device L to drive the light emitting device L to emit light. K is a structural constant relevant to the process and the design. Furthermore, the first transistor M1 is turned off under the control of the high level of the signal cs1. The sixth transistor M6 is turned off under the control of the high level of the signal ga. The third transistor M3 is turned off under the control of the high level of the signal rst.

It should be noted that as the refresh rate of the display apparatus is increasingly high, for example, from 60 Hz to 120 Hz, 240 Hz and the like, the turn-on duration of the sixth transistor M6 controlled by the signal ga will be shorter and shorter, which causes that in the threshold compensation phase T2, the quantity of electric charges for writing the signal of the data signal end DA into the storage capacitor CST through the driving transistor M0 is insufficient, resulting in inadequate threshold voltage compensation for the driving transistor M0. In the embodiments of the present disclosure, since the signal cs1 of the first control signal end CS1 and the signal ga of the scanning signal end GA are different, the first transistor M1 and the sixth transistor M6 may be respectively controlled to be turned on and turned off. In this way, when the pixel circuit provided by the embodiments of the present disclosure is applied to the display apparatus with a high refresh rate, both the first transistor M1 and the sixth transistor M6 are controlled to be turned on in the threshold compensation phase T2, so that the storage capacitor CST may be charged. Furthermore, through the first transistor M1 is continuously controlled to be turned on in the compensation holding phase T3, since the compensation capacitor CF stores the voltage Vda, the storage capacitor CST may be continuously charged, so that the voltage of the control end N3 of the driving transistor M0 can finally be up to Vda−|Vth|.

It should be noted that a buffer phase T5 may still exist between the compensation holding phase T3 and the light emitting phase T4. In the buffer phase T5, the first transistor M1, the third transistor M3, the fourth transistor m4, the fifth transistor M5 and the sixth transistor M6 may be all controlled to be turned off, so that the characteristics of the transistors in the pixel circuit can be stabilized. After the characteristics are stabilized, the next working phase is carried out, so that the stability of the pixel circuit can be improved.

It should be noted that in an actual application, the specific voltage values of the various above-mentioned signals may be designed and determined according to an actual application environment. No limitation is made here.

Figure 5:
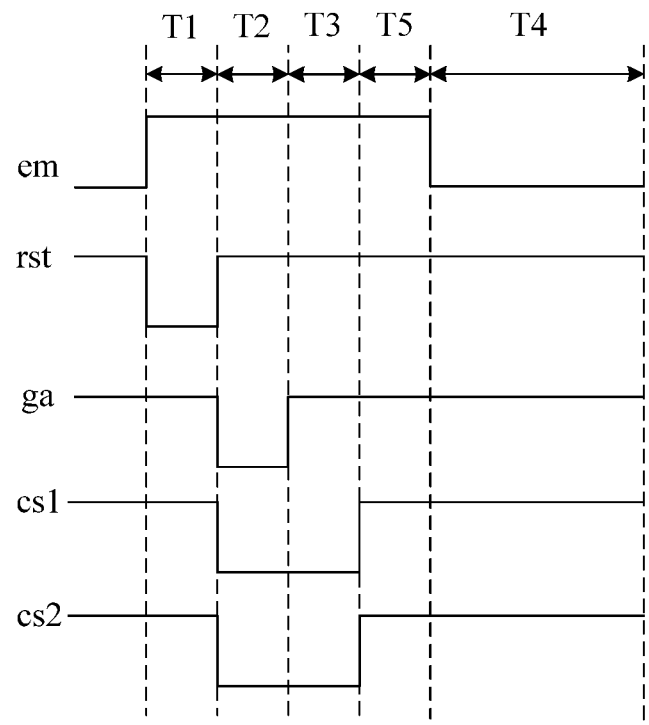
FIG. 5 illustrates some other signal time sequence diagrams in the embodiments of the present disclosure.

The embodiments of the present disclosure further provide some pixel circuits, the schematic structural diagrams of which are as shown in FIG. 5. Modifications are made to the implementation mode in the above embodiment. Only differences between the present embodiments and the above embodiments are explained below, and similarities are omitted herein.

Figure 4:
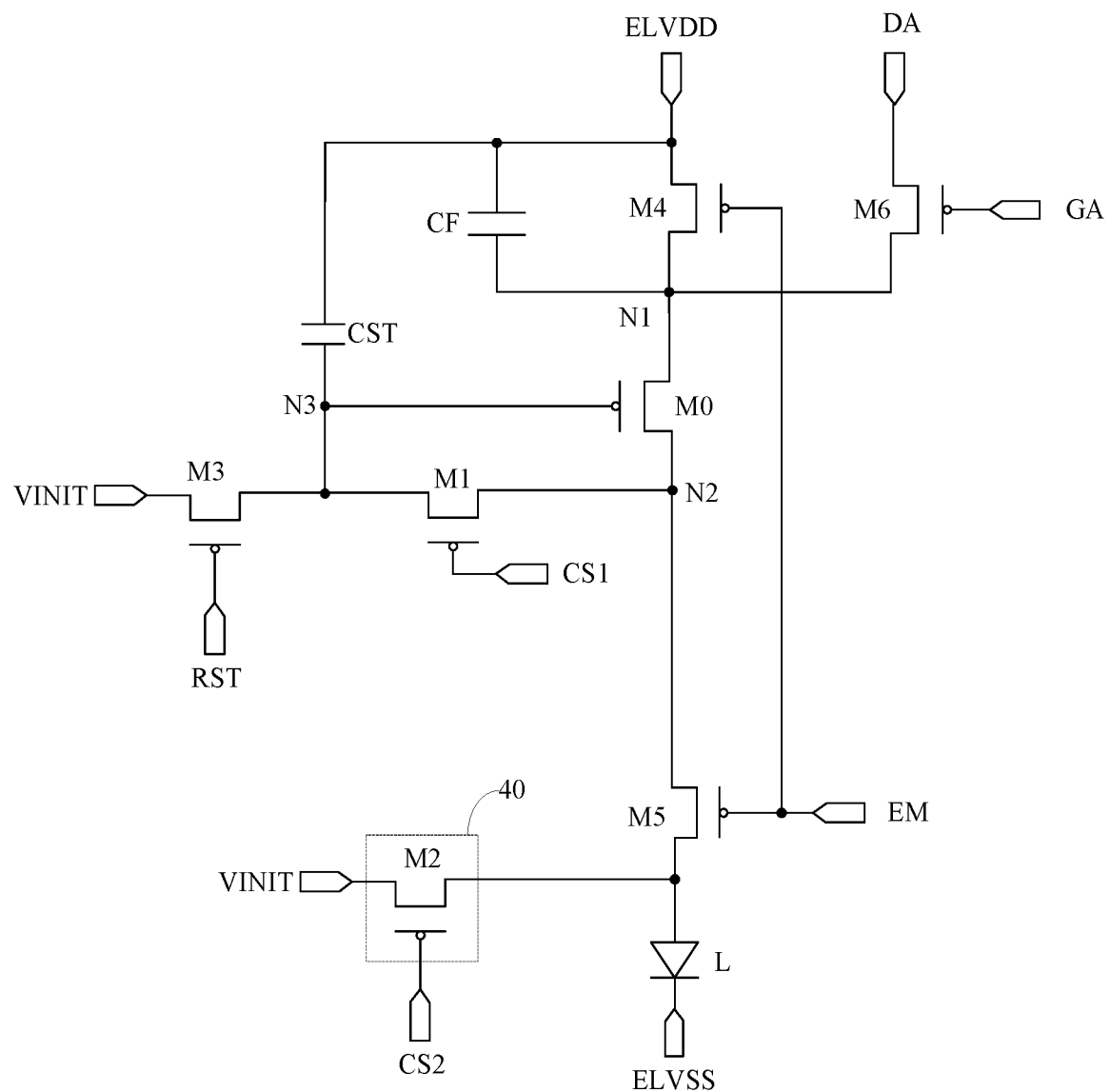
FIG. 4 illustrates a specific schematic structural diagram of some other pixel circuits in the embodiments of the present disclosure.

During specific implementation, in the embodiments of the present disclosure, as shown in FIG. 4, the pixel circuit may further include: a first reset circuit 40; wherein the first reset circuit 40 is electrically connected to the light emitting device L, and the first reset circuit 40 is configured to provide the signal of the initializing signal end VINIT to the light emitting device L under the control of the signal of the second control signal end CS2. In this way, the light emitting device L may be initialized.

During specific implementation, in the embodiments of the present disclosure, as shown in FIG. 4, the first reset circuit may include: a second transistor M2; wherein a control end of the second transistor M2 is electrically connected to the second control signal end CS2; a first end of the second transistor M2 is electrically connected to the initializing signal end VINIT; and a second end of the second transistor M2 is electrically connected to the light emitting device L.

During specific implementation, in the embodiments of the present disclosure, the driving method may further include:

in the reset phase, the first reset circuit providing the signal of the initializing signal end to the light emitting device under the control of the signal of the second control signal end;

in the threshold compensation phase, the first reset circuit providing the signal of the initializing signal end to the light emitting device under the control of the signal of the second control signal end; and in the compensation holding phase, the first reset circuit providing the signal of the initializing signal end to the light emitting device under the control of the signal of the second control signal end.

Or, during specific implementation, in the embodiments of the present disclosure, the driving method may further include: in the compensation holding phase, the first reset circuit providing the signal of the initializing signal end to the light emitting device under the control of the signal of the second control signal end.

Or, during specific implementation, in the embodiments of the present disclosure, before the reset phase, the driving method may further include: in an initializing phase, the first reset circuit providing the signal of the initializing signal end to the light emitting device under the control of the signal of the second control signal end.

Or, during specific implementation, in the embodiments of the present disclosure, after the reset phase, and before the threshold compensation phase, the driving method may further include: in the initializing phase, the first reset circuit providing the signal of the initializing signal end to the light emitting device under the control of the signal of the second control signal end.

Illustration is made below in combination with specific embodiments.

In some examples, the pixel circuit shown in FIG. 4 is taken as an example to describe the working process of the above-mentioned pixel circuit provided by the embodiments of the present disclosure in combination with the circuit time sequence diagram shown in FIG. 5. As shown in FIG. 5, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: a reset phase T1, a threshold compensation phase T2, a compensation holding phase T3 and a light emitting phase T4.

In the reset phase T1, the second transistor M2 is turned off under the control of the high level of the signal cs2. The rest of the working process in this phase may refer to the foregoing embodiments, which will not be elaborated here.

In the threshold compensation phase T2, the second transistor M2 is turned on under the control of the low level of the signal cs2, and may provide the signal of the initializing signal end VINIT to the light emitting device L to initialize the light emitting device L, so as to eliminate interfacial charges of a light emitting layer in the light emitting device L. The rest of the working process in this phase may refer to the foregoing embodiments, which will not be elaborated here.

In the compensation holding phase T3, the second transistor M2 is continuously turned on under the control of the low level of the signal cs2, and further provides the signal of the initializing signal end VINIT to the light emitting device L to initialize the light emitting device L, so as to further eliminate interfacial charges of the light emitting layer in the light emitting device L. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 6:
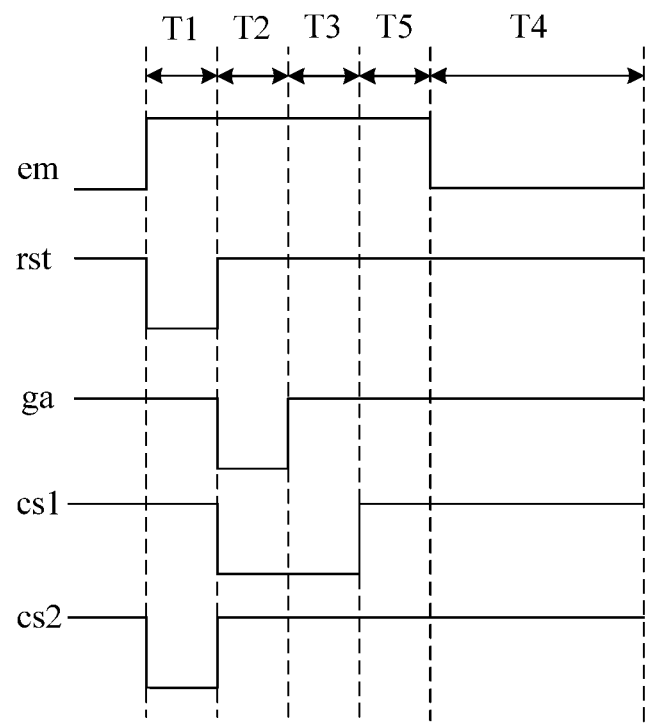
FIG. 6 illustrates some other signal time sequence diagrams in the embodiments of the present disclosure.

In some other examples, the pixel circuit shown in FIG. 4 is taken as an example to describe the working process of the above-mentioned pixel circuit provided by the embodiments of the present disclosure in combination with the circuit time sequence diagram shown in FIG. 6. As shown in FIG. 6, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: a reset phase T1, a threshold compensation phase T2, a compensation holding phase T3 and a light emitting phase T4.

In the reset phase T1, the second transistor M2 is turned on under the control of the low level of the signal cs2, and may provide the signal of the initializing signal end VINIT to the light emitting device L to initialize the light emitting device L, so as to eliminate interfacial charges of a light emitting layer in the light emitting device L. The rest of the working process in this phase may refer to the foregoing embodiments, which will not be elaborated here.

In the threshold compensation phase T2, the second transistor M2 is turned off under the control of the high level of the signal cs2. The rest of the working process in this phase may refer to the foregoing embodiments, which will not be elaborated here.

In the compensation holding phase T3, the second transistor M2 is turned off under the control of the high level of the signal cs2. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 7:
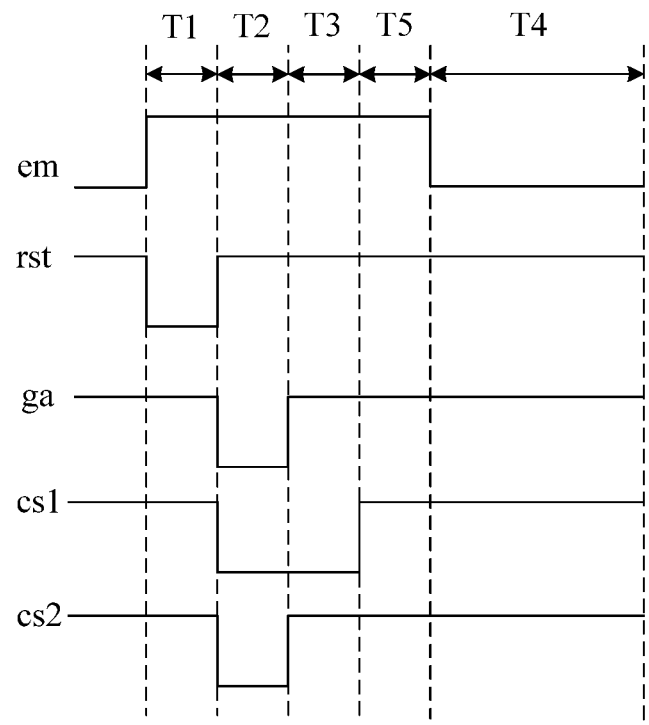
FIG. 7 illustrates some other signal time sequence diagrams in the embodiments of the present disclosure.

In some other examples, the pixel circuit shown in FIG. 4 is taken as an example to describe the working process of the above-mentioned pixel circuit provided by the embodiments of the present disclosure in combination with the circuit time sequence diagram shown in FIG. 7. As shown in FIG. 7, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: a reset phase T1, a threshold compensation phase T2, a compensation holding phase T3 and a light emitting phase T4.

In the reset phase T1, the second transistor M2 is turned off under the control of the high level of the signal cs2. The rest of the working process in this phase may refer to the foregoing embodiments, which will not be elaborated here.

In the threshold compensation phase T2, the second transistor M2 is turned on under the control of the low level of the signal cs2, and may provide the signal of the initializing signal end VINIT to the light emitting device L to initialize the light emitting device L, so as to eliminate interfacial charges of a light emitting layer in the light emitting device L. The rest of the working process in this phase may refer to the foregoing embodiments, which will not be elaborated here.

In the compensation holding phase T3, the second transistor M2 is turned off under the control of the high level of the signal cs2. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 8:
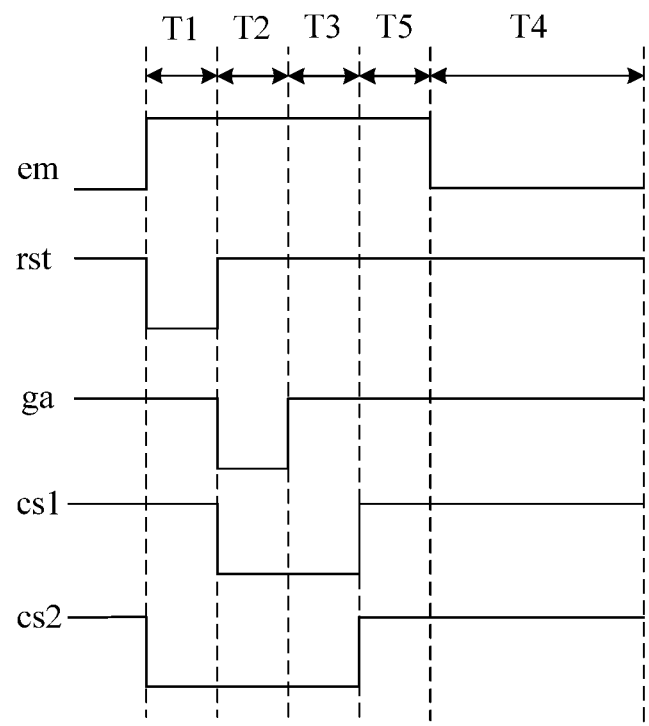
FIG. 8 illustrates some other signal time sequence diagrams in the embodiments of the present disclosure.

In some other examples, the pixel circuit shown in FIG. 4 is taken as an example to describe the working process of the above-mentioned pixel circuit provided by the embodiments of the present disclosure in combination with the circuit time sequence diagram shown in FIG. 8. As shown in FIG. 8, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: a reset phase T1, a threshold compensation phase T2, a compensation holding phase T3 and a light emitting phase T4.

In the reset phase T1, the second transistor M2 is turned on under the control of the low level of the signal cs2, and may provide the signal of the initializing signal end VINIT to the light emitting device L to initialize the light emitting device L, so as to eliminate interfacial charges of a light emitting layer in the light emitting device L. The rest of the working process in this phase may refer to the foregoing embodiments, which will not be elaborated here.

In the threshold compensation phase T2, the second transistor M2 is continuously turned on under the control of the low level of the signal cs2, and may provide the signal of the initializing signal end VINIT to the light emitting device L to initialize the light emitting device L, so as to further eliminate interfacial charges of a light emitting layer in the light emitting device L. The rest of the working process in this phase may refer to the foregoing embodiments, which will not be elaborated here.

In the compensation holding phase T3, the second transistor M2 is continuously turned on under the control of the low level of the signal cs2, and may provide the signal of the initializing signal end VINIT to the light emitting device L to initialize the light emitting device L, so as to further eliminate interfacial charges of the light emitting layer in the light emitting device L. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 9:
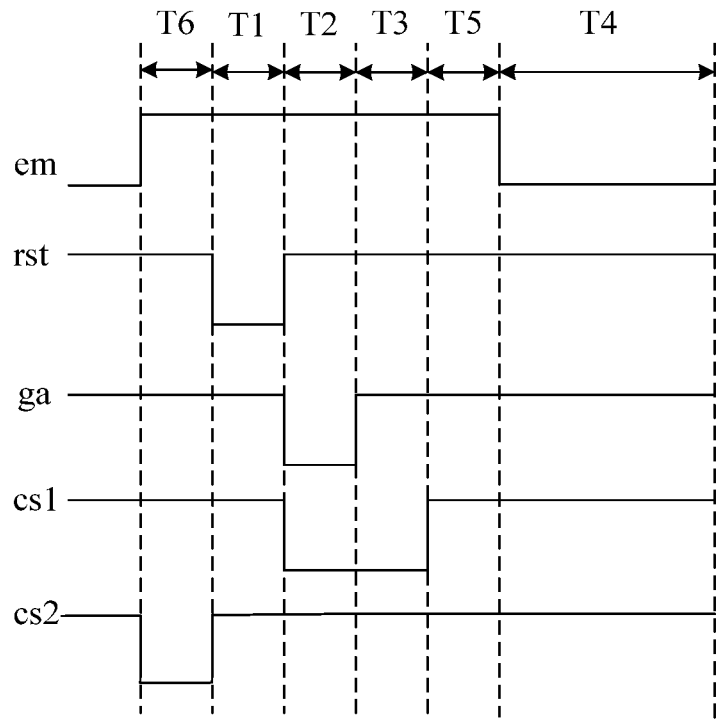
FIG. 9 illustrates some other signal time sequence diagrams in the embodiments of the present disclosure.

In some other examples, the pixel circuit shown in FIG. 4 is taken as an example to describe the working process of the above-mentioned pixel circuit provided by the embodiments of the present disclosure in combination with the circuit time sequence diagram shown in FIG. 9. As shown in FIG. 9, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: an initializing phase T6, a reset phase T1, a threshold compensation phase T2, a compensation holding phase T3 and a light emitting phase T4.

In the initializing phase T6, the second transistor M2 is turned on under the control of the low level of the signal cs2, and may provide the signal of the initializing signal end VINIT to the light emitting device L to initialize the light emitting device L, so as to eliminate interfacial charges of a light emitting layer in the light emitting device L. Furthermore, the sixth transistor M6 is turned off under the control of the high level of the signal ga. The third transistor M3 is turned off under the control of the high level of the signal rst. The fourth transistor M4 and the fifth transistor M5 are turned off under the control of the high level of the signal em.

In the reset phase T1, the second transistor M2 is turned off under the control of the high level of the signal cs2. The rest of the working process in this phase may refer to the foregoing embodiments, which will not be elaborated here.

In the threshold compensation phase T2, the second transistor M2 is turned off under the control of the high level of the signal cs2. The rest of the working process in this phase may refer to the foregoing embodiments, which will not be elaborated here.

In the compensation holding phase T3, the second transistor M2 is turned off under the control of the high level of the signal cs2. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 10:
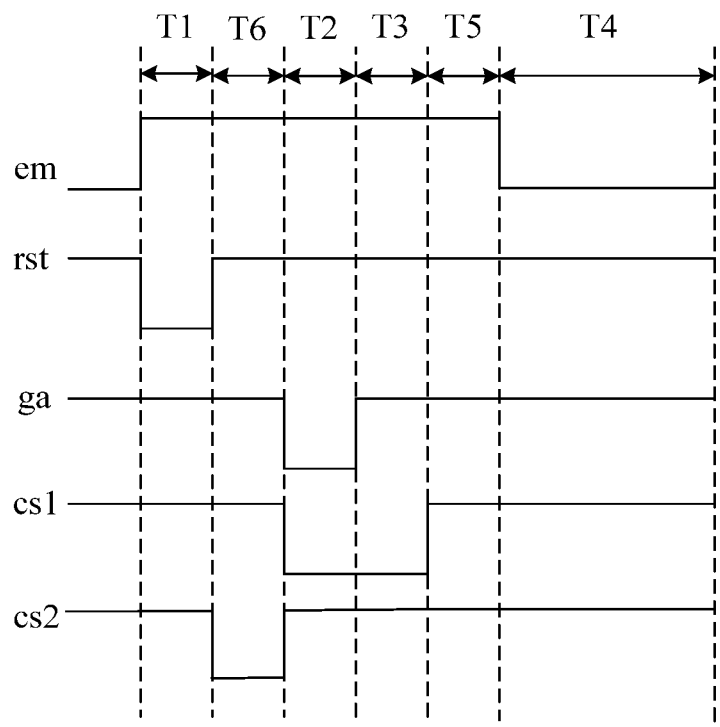
FIG. 10 illustrates some other signal time sequence diagrams in the embodiments of the present disclosure.

In some other examples, the pixel circuit shown in FIG. 4 is taken as an example to describe the working process of the above-mentioned pixel circuit provided by the embodiments of the present disclosure in combination with the circuit time sequence diagram shown in FIG. 10. As shown in FIG. 10, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: a reset phase T1, an initializing phase T6, a threshold compensation phase T2, a compensation holding phase T3 and a light emitting phase T4.

In the reset phase T1, the second transistor M2 is turned off under the control of the high level of the signal cs2. The rest of the working process in this phase may refer to the foregoing embodiments, which will not be elaborated here.

In the initializing phase T6, the second transistor M2 is turned on under the control of the low level of the signal cs2, and may provide the signal of the initializing signal end VINIT to the light emitting device L to initialize the light emitting device L, so as to eliminate interfacial charges of a light emitting layer in the light emitting device L. Furthermore, the sixth transistor M6 is turned off under the control of the high level of the signal ga. The third transistor M3 is turned off under the control of the high level of the signal rst. The fourth transistor M4 and the fifth transistor M5 are turned off under the control of the high level of the signal em.

In the threshold compensation phase T2, the second transistor M2 is turned off under the control of the high level of the signal cs2. The rest of the working process in this phase may refer to the foregoing embodiments, which will not be elaborated here.

In the compensation holding phase T3, the second transistor M2 is turned off under the control of the high level of the signal cs2. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 11:
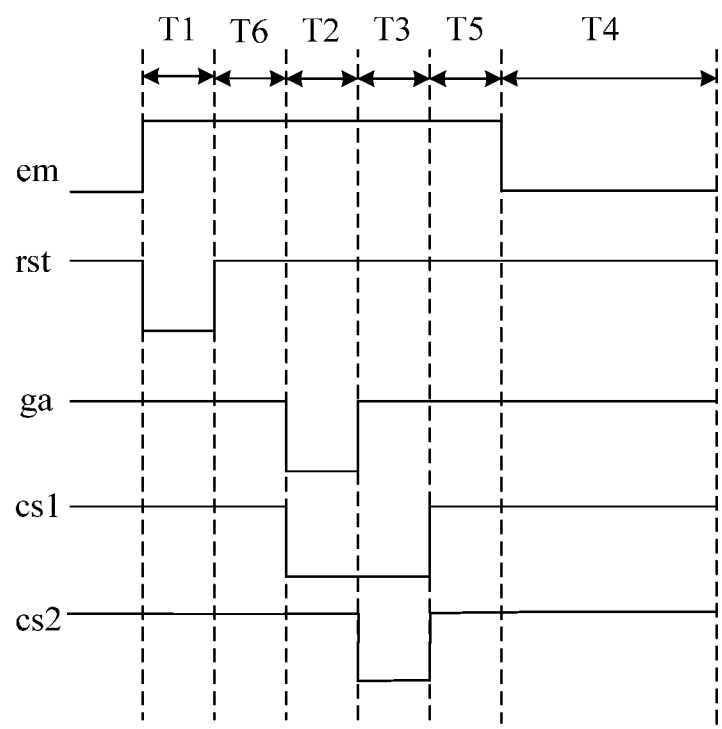
FIG. 11 illustrates some other signal time sequence diagrams in the embodiments of the present disclosure.

In some other examples, the pixel circuit shown in FIG. 4 is taken as an example to describe the working process of the above-mentioned pixel circuit provided by the embodiments of the present disclosure in combination with the circuit time sequence diagram shown in FIG. 11. As shown in FIG. 11, em represents the signal loaded to the light emitting control signal end EM; rst represents the signal loaded to the reset signal end RST; ga represents the signal loaded to the scanning signal end GA; cs1 represents the signal loaded to the first control signal end CS1; and cs2 represents the signal loaded to the second control signal end. Furthermore, the working process of one pixel circuit in one display frame may include: a reset phase T1, a threshold compensation phase T2, a compensation holding phase T3 and a light emitting phase T4.

In the reset phase T1, the second transistor M2 is turned off under the control of the high level of the signal cs2. The rest of the working process in this phase may refer to the foregoing embodiments, which will not be elaborated here.

In the threshold compensation phase T2, the second transistor M2 is turned off under the control of the high level of the signal cs2. The rest of the working process in this phase may refer to the foregoing embodiments, which will not be elaborated here.

In the compensation holding phase T3, the second transistor M2 is continuously turned on under the control of the low level of the signal cs2, and may provide the signal of the initializing signal end VINIT to the light emitting device L to initialize the light emitting device L, so as to further eliminate interfacial charges of the light emitting layer in the light emitting device L. The rest of the working process in this phase may refer to the foregoing embodiments, which will not be elaborated here.

In the light emitting phase T4, the second transistor M2 is turned off under the control of the high level of the signal cs2. The rest of the working process in this phase may refer to the foregoing embodiments, which will not be elaborated here.

Figure 12:
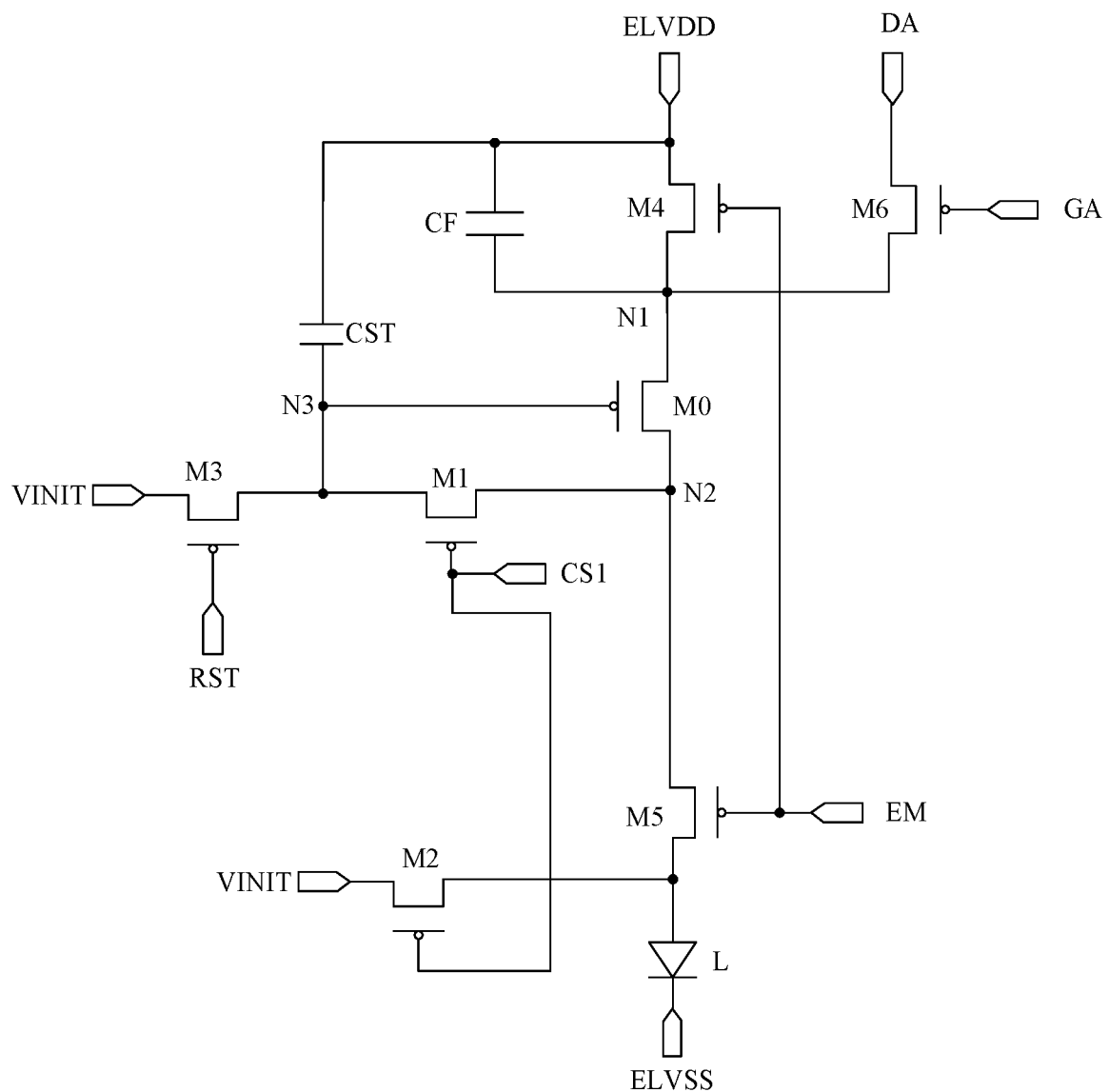
FIG. 12 illustrates a specific schematic structural diagram of some other pixel circuits in the embodiments of the present disclosure.

The embodiments of the present disclosure further provide some pixel circuits, the schematic structural diagrams of which are as shown in FIG. 12. Modifications are made to the implementation mode in the above embodiments. Only differences between the present embodiments and the above embodiments are explained below, and similarities are not elaborated herein.

During specific implementation, in the embodiments of the present disclosure, the first control signal end CS1 and the second control signal end may be the same signal end. Exemplarily, as shown in FIG. 12, both the control end of the first transistor M1 and the control end of the second transistor M2 are electrically connected to the first control signal end CS1.

During specific implementation, in the embodiments of the present disclosure, the driving method may further include:
  in the threshold compensation phase, the first reset circuit providing the signal of the initializing signal end to the light emitting device under the control of the signal of the second control signal end; and
  in the compensation holding phase, the first reset circuit providing the signal of the initializing signal end to the light emitting device under the control of the signal of the second control signal end.

It should be noted that the signal time sequence diagram corresponding to the pixel circuit shown in FIG. 12 is as shown in FIG. 5, and the working process may refer to the working process of the pixel circuit shown in FIG. 4 under the control of the signal time sequence diagram shown in FIG. 5, which will not be elaborated here.

Figure 13:
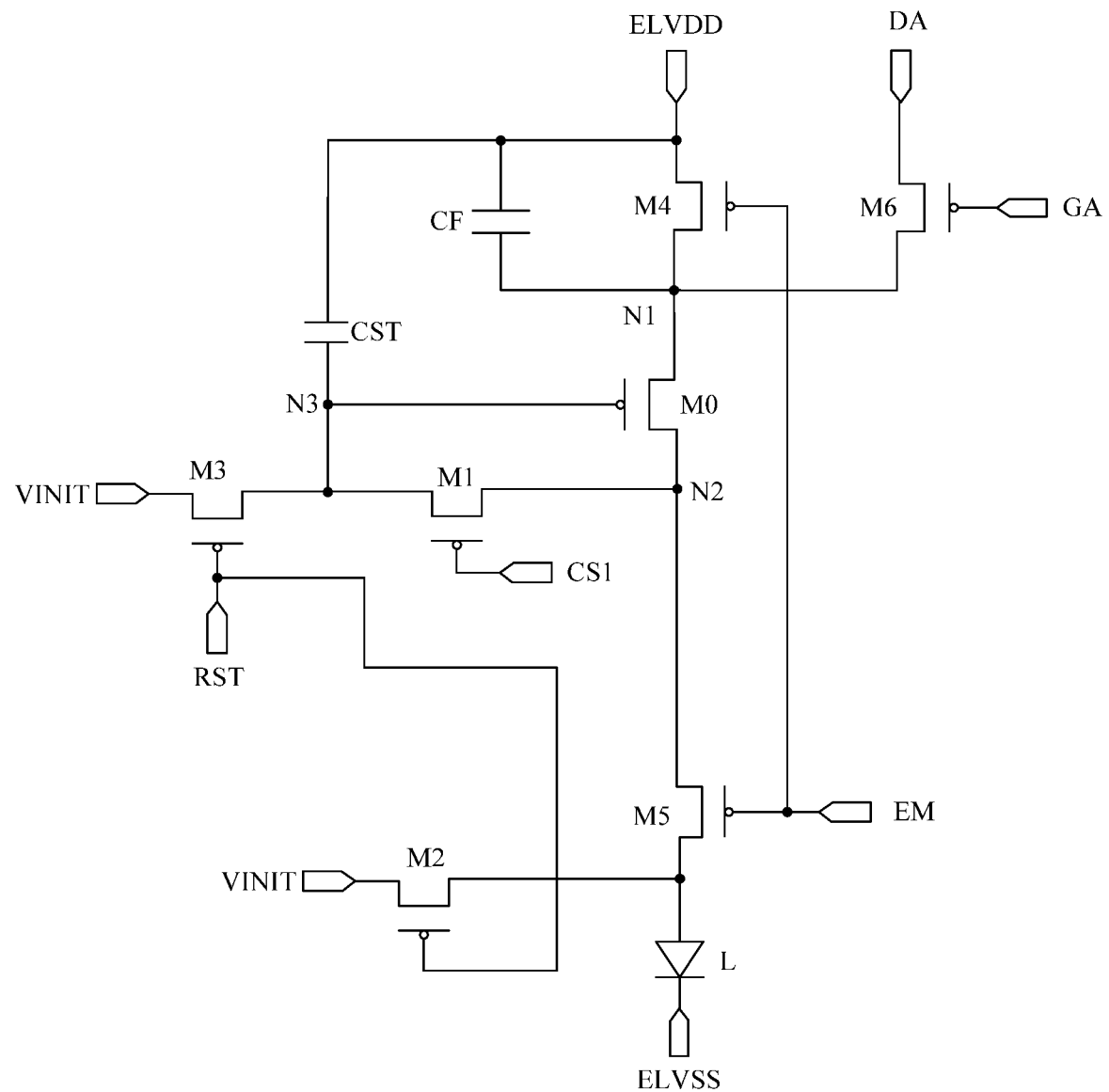
FIG. 13 illustrates a specific schematic structural diagram of some other pixel circuits in the embodiments of the present disclosure.

The embodiments of the present disclosure further provide some pixel circuits, the schematic structural diagrams of which are as shown in FIG. 13. Modifications are made to the implementation mode in the above embodiment. Only differences between the present embodiments and the above embodiments are explained below, and similarities are not elaborated herein.

During specific implementation, in the embodiments of the present disclosure, the second control signal end and the reset signal end RST may be the same signal end. Exemplarily, as shown in FIG. 13, both the control end of the first transistor M1 and the control end of the second transistor M2 are electrically connected to the reset signal end RST.

During specific implementation, in the embodiments of the present disclosure, the driving method may further include: in the reset phase, the first reset circuit providing the signal of the initializing signal end to the light emitting device under the control of the signal of the second control signal end.

It should be noted that the signal time sequence diagram corresponding to the pixel circuit shown in FIG. 13 is as shown in FIG. 6, and the working process may refer to the working process of the pixel circuit shown in FIG. 4 under the control of the signal time sequence diagram shown in FIG. 6, which will not be elaborated here.

Figure 14:
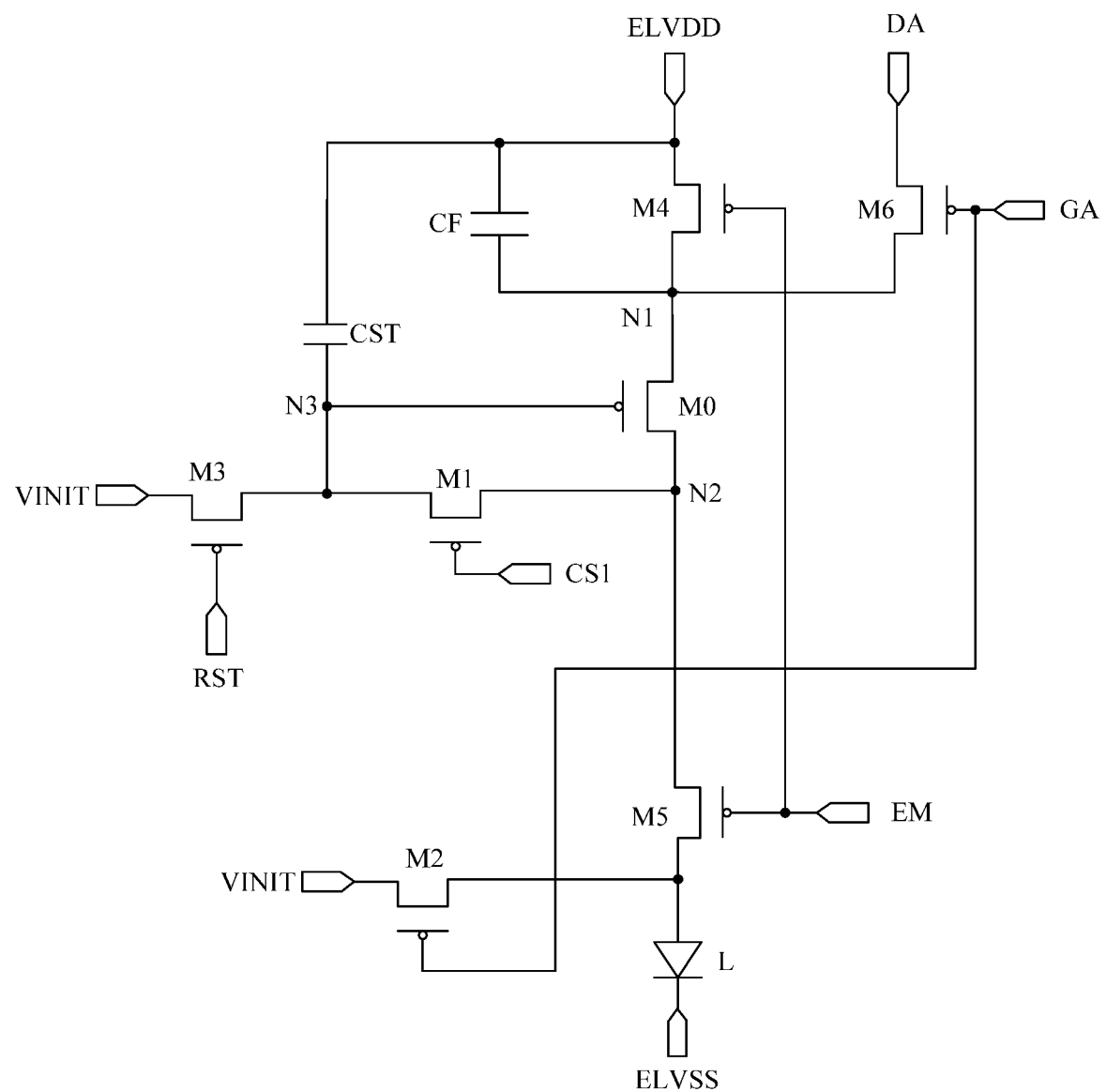
FIG. 14 illustrates a specific schematic structural diagram of some other pixel circuits in the embodiments of the present disclosure.

The embodiments of the present disclosure further provide some pixel circuits, the schematic structural diagrams of which are as shown in FIG. 14. Modifications are made to the implementation mode in the above embodiment. Only differences between the present embodiments and the above embodiments are explained below, and similarities are not elaborated herein.

During specific implementation, in the embodiments of the present disclosure, the second control signal end and the scanning signal end GA are the same signal end. Exemplarily, as shown in FIG. 14, both the control end of the first transistor M1 and the control end of the second transistor M2 are electrically connected to the scanning signal end GA.

During specific implementation, in the embodiments of the present disclosure, the driving method may further include: in the threshold compensation phase, the first reset circuit providing the signal of the initializing signal end to the light emitting device under the control of the signal of the second control signal end.

It should be noted that the signal time sequence diagram corresponding to the pixel circuit shown in FIG. 14 is as shown in FIG. 7, and the working process may refer to the working process of the pixel circuit shown in FIG. 4 under the control of the signal time sequence diagram shown in FIG. 7, which will not be elaborated here.

Figure 15:
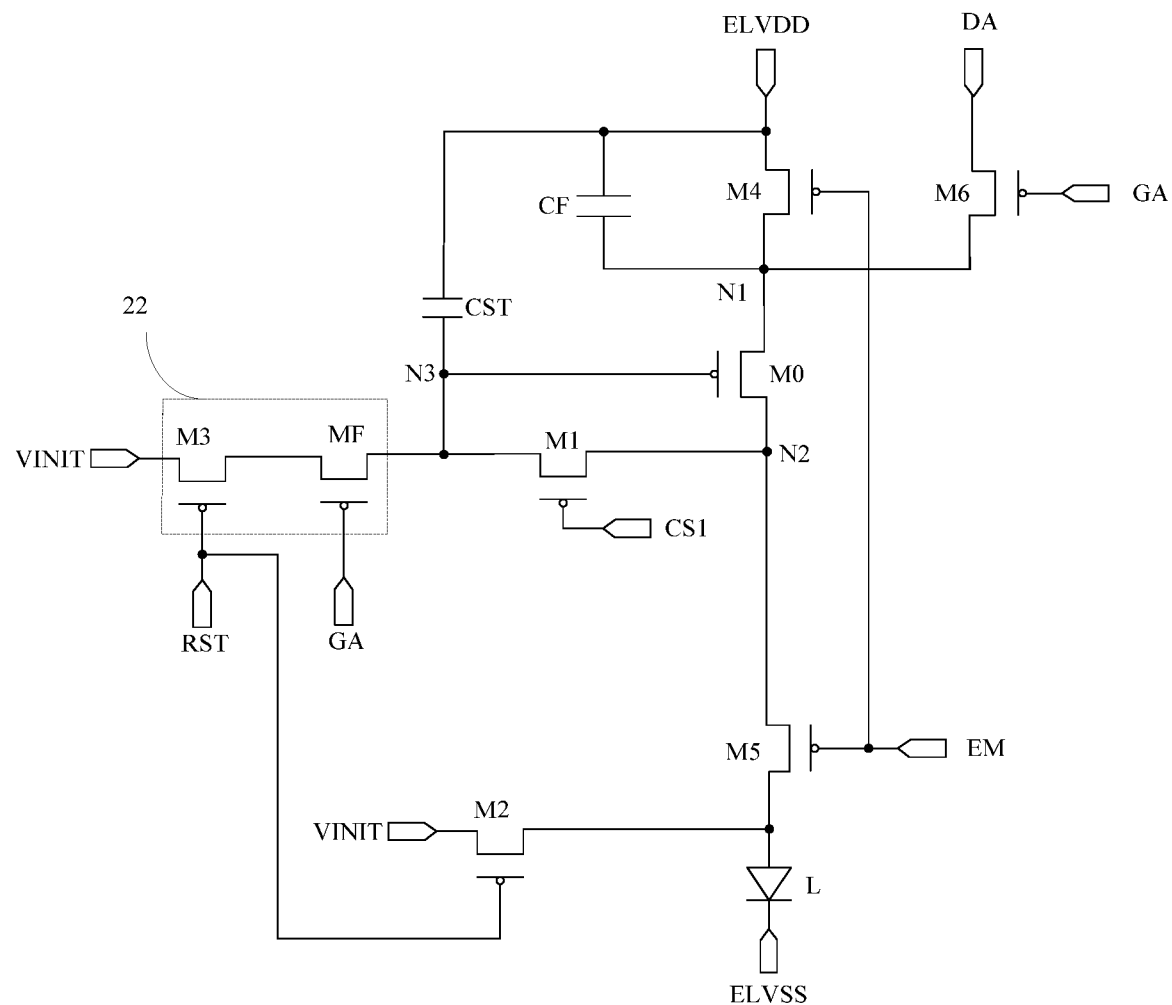
FIG. 15 illustrates a specific schematic structural diagram of some other pixel circuits in the embodiments of the present disclosure.

The embodiments of the present disclosure further provide some pixel circuits, the schematic structural diagrams of which are as shown in FIG. 15. Modifications are made to the implementation mode in the above embodiments. Only differences between the present embodiments and the above embodiments are explained below, and similarities are not elaborated herein.

During specific implementation, in the embodiments of the present disclosure, as shown in FIG. 15, the second reset circuit 22 may further include: an auxiliary transistor MF. A control end of the auxiliary transistor MF is electrically connected to a scanning signal end GA; a first end of the auxiliary transistor MF is electrically connected to the second end of the third transistor M3; and a second end of the auxiliary transistor MF is electrically connected to the control end of the driving transistor M0.

In some examples, the pixel circuit further includes: a first reset circuit. Before the reset phase, the driving method further includes: an anode reset phase; wherein in the anode reset phase, the first reset circuit provides the signal of the initializing signal end to the light emitting device under the control of the signal of the second control signal end to initialize the light emitting device. Moreover, the driving method further includes: in the reset phase, the first reset circuit providing the signal of the initializing signal end to the light emitting device under the control of the signal of the second control signal end to initialize the light emitting device; and the data writing circuit providing the signal of the data signal end to the first end of the driving transistor under the control of the signal of the scanning signal end.

Figure 16:
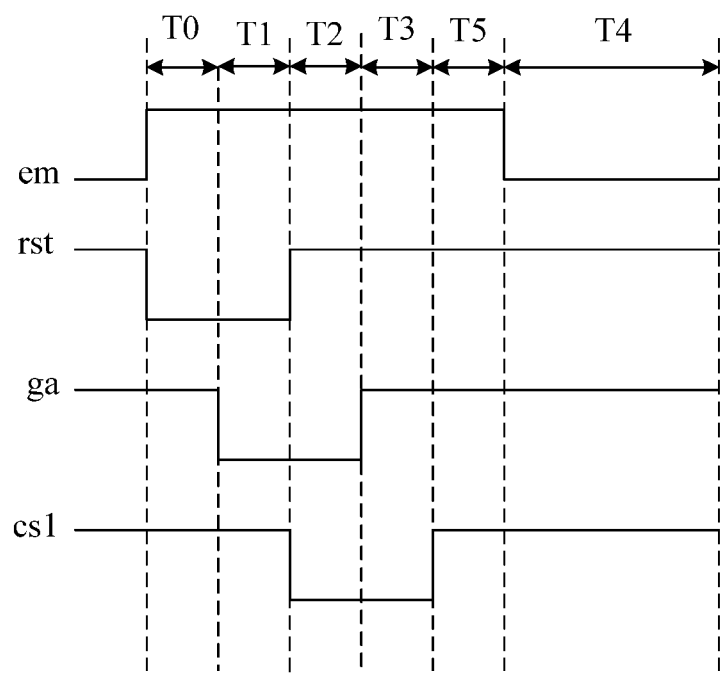
FIG. 16 illustrates some other signal time sequence diagrams in the embodiments of the present disclosure.

The pixel circuit shown in FIG. 15 is taken as an example below to describe the working process of the above-mentioned pixel circuit provided by the embodiments of the present disclosure in combination with the circuit time sequence diagram shown in FIG. 16. As shown in FIG. 16, em represents the signal loaded to the light emitting control signal end EM; rst represents the signal loaded to the reset signal end RST; ga represents the signal loaded to the scanning signal end GA; and cs1 represents the signal loaded to the first control signal end CS1. Furthermore, the working process of one pixel circuit in one display frame may include: an anode reset phase T0, a reset phase T1, a threshold compensation phase T2, a compensation holding phase T3, a buffer phase T5 and a light emitting phase T4.

In the anode reset phase T0, the third transistor M3 is turned on under the control of the low level of the signal rst to provide the signal of the initializing signal end VINIT to the first end of the auxiliary transistor MF. Furthermore, the second transistor M2 is turned on under the control of the low level of the signal rst to provide the signal of the initializing signal end VINIT to the light emitting device, so as to initialize the light emitting device L. The first transistor M1 is turned off under the control of the high level of the signal cs1. The sixth transistor M6 and the auxiliary transistor MF are turned off under the control of the high level of the signal ga. The fourth transistor M4 and the fifth transistor M5 are turned off under the control of the high level of the signal em. The auxiliary transistor MF is turned off under the control of the high level of the signal ga.

In the reset phase T1, the third transistor M3 is turned on under the control of the low level of the signal rst, and the auxiliary transistor MF is turned on under the control of the low level of the signal ga to provide the signal of the initializing signal end VINIT to the control end N3 of the driving transistor M0, so as to make the voltage of the control end N3 of the driving transistor M0 be Vini, thereby initializing the control end of the driving transistor M0. Furthermore, the second transistor M2 is turned on under the control of the low level of the signal rst to provide the signal of the initializing signal end VINIT to the light emitting device L, so as to initialize the light emitting device L. The sixth transistor M6 provides the signal of the data signal end DA to the first end of the driving transistor M0 under the control of the low level of the signal ga. The first transistor M1 is turned off under the control of the high level of the signal cs1. The fourth transistor M4 and the fifth transistor M5 are turned off under the control of the high level of the signal em.

In the threshold compensation phase T2, the sixth transistor M6 is turned on under the control of the low level of the signal ga to provide the signal of the data signal end DA to the first end N1 of the driving transistor M0, so that the voltage of the first end N1 of the driving transistor M0 is as the voltage Vda of the signal of the data signal end DA. The first transistor M1 is turned on under the control of a low level of the signal cs1 to turn on the control end N3 and the second end N2 of the driving transistor M0, so that the driving transistor M0 forms a diode connection mode to further cause the voltage Vda of the first end N1 of the driving transistor M0 to charge the control end N3 of the driving transistor M0. Furthermore, the third transistor M3 and the second transistor M2 are turned off under the control of the high level of the signal rst. The fourth transistor M4 and the fifth transistor M5 are turned off under the control of the high level of the signal em.

In the buffer phase T5, all the transistors are turned off Therefore, the characteristics of the transistors in the pixel circuit can be stabilized. After the characteristics are stabilized, the light emitting phase is carried out, so that the stability of the pixel circuit may be improved.

In the light emitting phase T4, both the fourth transistor M4 and the fifth transistor M5 are turned on under the control of the low level of the signal em. The turned-on fourth transistor M4 may provide the voltage Vdd of the first power end ELVDD to the first end N1 of the driving transistor M0 to cause the voltage of the first end N1 of the driving transistor M0 to be Vdd. In this way, the driving transistor M0 may be in a saturated state, so that the driving transistor M0 generates a working current Ids: Ids=K(Vdd−

Vda)². The turned-on fifth transistor M5 may turn on the second end N2 of the driving transistor M0 and the light emitting device L, so that the working current Ids flows into the light emitting device L to drive the light emitting device L to emit light; wherein K is a structural constant relevant to the process and the design. Furthermore, the first transistor M1 is turned off under the control of the high level of the signal cs1. The sixth transistor M6 and the auxiliary transistor MF are turned off under the control of the high level of the signal ga. The third transistor M3 and the second transistor M2 are turned off under the control of the high level of the signal rst.

Based on the same inventive concept, the embodiments of the present disclosure further provide a display apparatus, including the above-mentioned pixel circuit provided by the embodiments of the present disclosure. The principle of the display apparatus for solving problems is similar to that of the foregoing pixel circuit, so the implementation of this display apparatus may refer to the implementation of the foregoing pixel circuit, and repeated descriptions will be omitted.

During specific implementation, in the embodiments of the present disclosure, the display apparatus may be: any product or component having a display function, such as a mobile phone, a tablet computer, a television, a display, a notebook computer, a digital photo frame and a navigator. Other indispensable components of the display apparatus are all understood by those skilled in the art, are not elaborated herein and should not be construed as limiting the present disclosure.

According to the above-mentioned pixel circuit and the driving method therefor, and the display apparatus provided by the embodiments of the present disclosure, the control end of the driving transistor may be initialized through the control circuit. The signal of the data signal end may be provided to the first end of the driving transistor through the data writing circuit under the control of the signal of the scanning signal end. Through the arrangement of the compensation capacitor, since the compensation capacitor is electrically connected to the first end of the driving transistor, the signal input to the first end of the driving transistor may be stored, so that a voltage input to the first end of the driving transistor can be stabilized. In this way, when the control circuit enables the second end of the driving transistor and the light emitting device to be turned on, the light emitting device may be stably driven to emit light, so that the display uniformity may be improved.

Although the preferred embodiments of the present invention have been described, those skilled in the art can make other changes and modifications to these embodiments once they acquire the basic creative concept. Therefore, attached claims are intended to be explained as including the preferred embodiments and all the changes and modifications that fall within the scope of the present invention.

Obviously, those skilled in the art can make various changes and transformations to the embodiments of the present invention without departing from the spirit and scope of the present invention. Therefore, if these changes and transformations of the embodiments of the present invention fall within the scope of the claims of the present invention and equivalent technologies of the present invention, the present invention is intended to include these changes and transformations.

What is claimed is:

1. A pixel circuit, comprising:
   a data writing circuit, which is electrically connected to a first end of a driving transistor and is configured to provide a signal of a data signal end to the first end of the driving transistor under a control of a signal of a scanning signal end;
   a compensation capacitor, wherein a first end of the compensation capacitor is electrically connected to a first power end, and a second end of the compensation capacitor is electrically connected to the first end of the driving transistor;
   a storage circuit, which is electrically connected to a control end of the driving transistor and the first power end respectively;
   a second reset circuit, which is electrically connected to the control end of the driving transistor and is configured to initialize the control end of the driving transistor according to a signal of an initializing signal end; and
   a light emitting control circuit, which is electrically connected to the first power end, the first end and a second end of the driving transistor and a light emitting device, and is configured to turn on the first power end and the first end of the driving transistor and turn on the second end of the driving transistor and the light emitting device under a control of a signal of a light emitting control signal end, for driving the light emitting device to emit light;
   wherein the second reset circuit comprises: a third transistor;
   wherein a control end of the third transistor is electrically connected to a reset signal end, a first end of the third transistor is electrically connected to the initializing signal end, and a second end of the third transistor is electrically connected to the control end of the driving transistor;
   wherein the second reset circuit further comprises: an auxiliary transistor,
   wherein a control end of the auxiliary transistor is electrically connected to the scanning signal end, a first end of the auxiliary transistor is electrically connected to the second end of the third transistor, and a second end of the auxiliary transistor is electrically connected to the control end of the driving transistor.

2. The pixel circuit according to claim 1, further comprising:
   a threshold compensation circuit, which is electrically connected to the control end and the second end of the driving transistor respectively, and is configured to turn on the control end and the second end of the driving transistor under a control of a signal of a first control signal end, for compensating a threshold.

3. The pixel circuit according to claim 2, wherein the threshold compensation circuit comprises: a first transistor;
   wherein a control end of the first transistor is electrically connected to the first control signal end, a first end of the first transistor is electrically connected to the control end of the driving transistor, and a second end of the first transistor is electrically connected to the second end of the driving transistor.

4. The pixel circuit according to claim 1, further comprising:
   a first reset circuit, which is electrically connected to the light emitting device and is configured to provide the signal of the initializing signal end to the light emitting device under a control of a signal of a second control signal end.

5. The pixel circuit according to claim 4, wherein the first reset circuit comprises: a second transistor;

wherein a control end of the second transistor is electrically connected to the second control signal end, a first end of the second transistor is electrically connected to the initializing signal end, and a second end of the second transistor is electrically connected to the light emitting device.

6. The pixel circuit according to claim 1, wherein the storage circuit comprises: a storage capacitor;
wherein a first end of the storage capacitor is electrically connected to the first power end, and a second end of the storage capacitor is electrically connected to the control end of the driving transistor.

7. The pixel circuit according to claim 1, wherein the light emitting control circuit comprises:
a fourth transistor, wherein a control end of the fourth transistor is electrically connected to the light emitting control signal end, a first end of the fourth transistor is electrically connected to the first power end, and a second end of the fourth transistor is electrically connected to the first end of the driving transistor; and
a fifth transistor, wherein a control end of the fifth transistor is electrically connected to the light emitting control signal end, a first end of the fifth transistor is electrically connected to the second end of the driving transistor, and a second end of the fifth transistor is electrically connected to the light emitting device.

8. The pixel circuit according to claim 1, wherein the data writing circuit comprises: a sixth transistor;
wherein a control end of the sixth transistor is electrically connected to the scanning control signal end, a first end of the sixth transistor is electrically connected to the data signal end, and a second end of the sixth transistor is electrically connected to the first end of the driving transistor.

9. A driving method for driving the pixel circuit according to claim 1, comprising:
in a reset phase: the second reset circuit initializing the control end of the driving transistor according to the signal of the initializing signal end;
in a threshold compensation phase: the data writing circuit providing the signal of the data signal end to the first end of the driving transistor and storing the signal through the compensation capacitor under the control of the signal of the scanning signal end, and the threshold compensation circuit turning on the control end and the second end of the driving transistor under a control of the signal of the first control signal end for compensating a threshold;
in a compensation holding phase: the threshold compensation circuit turning on the control end and the second end of the driving transistor under the control of the signal of the first control signal to for compensating a threshold; and
in a light emitting phase: the light emitting control circuit turning on the first power end and the first end of the driving transistor and turning on the second end of the driving transistor and the light emitting device under the control of the signal of the light emitting control signal end, for driving the light emitting device to emit light.

10. The driving method according to claim 9, wherein a second control signal end and the first control signal end are a same signal end, and
the driving method further comprises:
in the threshold compensation phase, a first reset circuit providing the signal of the initializing signal end to the light emitting device under a control of a signal of the second control signal end; and
in the compensation holding phase, the first reset circuit providing the signal of the initializing signal end to the light emitting device under the control of the signal of the second control signal end.

11. The driving method according to claim 9, wherein a second control signal end and a reset signal end are a same signal end, and
the driving method further comprises:
in the reset phase a first reset circuit providing the signal of the initializing signal end to the light emitting device under a control of a signal of the second control signal end.

12. The driving method according to claim 9, wherein a second control signal end and the scanning signal end are a same signal end, and
the driving method further comprises:
in the threshold compensation phase, a first reset circuit providing the signal of the initializing signal end to the light emitting device under a control of a signal of the second control signal end.

13. The driving method according to claim 9, further comprising:
in the reset phase, a first reset circuit providing the signal of the initializing signal end to the light emitting device under a control of a signal of a second control signal end;
in the threshold compensation phase, the first reset circuit providing the signal of the initializing signal end to the light emitting device under the control of the signal of the second control signal end; and
in the compensation holding phase, the first reset circuit providing the signal of the initializing signal end to the light emitting device under the control of the signal of the second control signal end.

14. The driving method according to claim 9, further comprising:
in the compensation holding phase, a first reset circuit providing the signal of the initializing signal end to the light emitting device under a control of a signal of a second control signal end.

15. The driving method according to claim 9, wherein before the reset phase, the driving method further comprises:
in an initializing phase: a first reset circuit providing the signal of the initializing signal end to the light emitting device under a control of a signal of a second control signal end.

16. The driving method according to claim 9, wherein after the reset phase and before the threshold compensation phase, the driving method further comprises:
in an initializing phase: a first reset circuit providing the signal of the initializing signal end to the light emitting device under a control of a signal of a second control signal end.

17. The driving method according to claim 9, the pixel circuit further comprising: a first reset circuit; before the reset phase, the driving method further comprising: an anode reset phase; wherein in the anode reset phase, a first reset circuit provides the signal of the initializing signal end to the light emitting device under a control of a signal of a second control signal end to initialize the light emitting device; and
the driving method further comprising: in the reset phase, the first reset circuit providing the signal of the initializing signal end to the light emitting device under the control of the signal of the second control signal end to initialize the light emitting device; and the data writing circuit providing the signal of the data signal end to the first end of the driving transistor under the control of the signal of the scanning signal end.

18. A display apparatus, comprising the pixel circuit according to claim 1.

* * * * *